United States Patent
Na et al.

(10) Patent No.: US 10,587,095 B2
(45) Date of Patent: Mar. 10, 2020

(54) VERTICAL CAVITY SURFACE EMITTING LASER INCLUDING META STRUCTURE REFLECTOR AND OPTICAL DEVICE INCLUDING THE VERTICAL CAVITY SURFACE EMITTING LASER

(71) Applicant: SAMSUNG ELECTRONICS CO., LTD., Suwon-si (KR)

(72) Inventors: Byunghoon Na, Suwon-si (KR); Seunghoon Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 186 days.

(21) Appl. No.: 15/804,537

(22) Filed: Nov. 6, 2017

(65) Prior Publication Data

US 2018/0278023 A1  Sep. 27, 2018

(30) Foreign Application Priority Data

Mar. 23, 2017 (KR) ........................ 10-2017-0036920

(51) Int. Cl.
| | |
|---|---|
| *H01S 5/183* | (2006.01) |
| *H01S 5/187* | (2006.01) |
| *H01S 5/024* | (2006.01) |
| *G01D 5/30* | (2006.01) |
| *G01B 11/02* | (2006.01) |

(52) U.S. Cl.
CPC ...... *H01S 5/18361* (2013.01); *H01S 5/02469* (2013.01); *H01S 5/187* (2013.01); *H01S 5/18386* (2013.01); *G01B 11/02* (2013.01); *G01D 5/30* (2013.01); *H01S 5/18308* (2013.01); *H01S 5/18341* (2013.01); *H01S 2301/176* (2013.01)

(58) Field of Classification Search
CPC .. H01S 5/18386; H01S 5/18361; H01S 5/183; G01D 5/30; G01B 11/02
USPC ..................................................... 372/50.11
See application file for complete search history.

(56) References Cited

U.S. PATENT DOCUMENTS

| | | | |
|---|---|---|---|
| 6,683,898 B2 * | 1/2004 | Østergaard et al. | H01S 5/18355 372/43.01 |
| 7,693,203 B2 * | 4/2010 | Birkedal | H01S 5/183 372/43.01 |
| 2002/0163947 A1 * | 11/2002 | Ostergaard | H01S 5/18355 372/43.01 |

(Continued)

FOREIGN PATENT DOCUMENTS

| | | | |
|---|---|---|---|
| CN | 106058642 A | 10/2016 | |
| JP | 4275948 B2 | 6/2009 | |

(Continued)

OTHER PUBLICATIONS

J. Piprek et al., "Thermal Conductivity Reduction in GaAs—AlAs Distributed Bragg Reflectors", IEEE Photonics Technology Letters, vol. 10, No. 1, Jan. 1998, (pp. 81-83).

(Continued)

*Primary Examiner* — Tuan N Nguyen
(74) *Attorney, Agent, or Firm* — Sughrue Mion, PLLC

(57) ABSTRACT

A vertical cavity surface emitting laser includes a gain layer configured to generate light; a distributed Bragg reflector below the gains layer; and a meta structure reflector above the gain layer and comprising a plurality of nano structures having a sub wavelength dimension.

20 Claims, 8 Drawing Sheets

(56) References Cited

U.S. PATENT DOCUMENTS

| 2011/0315898 | A1* | 12/2011 | Capasso | B82Y 20/00 |
|---|---|---|---|---|
| | | | | 250/492.1 |
| 2012/0128019 | A1 | 5/2012 | Chang-Hasnain et al. | |
| 2014/0059830 | A1* | 3/2014 | Morel | H01S 5/18377 |
| | | | | 29/428 |
| 2016/0156883 | A1 | 6/2016 | Han et al. | |
| 2016/0307939 | A1* | 10/2016 | Wang | H01L 27/1443 |

FOREIGN PATENT DOCUMENTS

| JP | 4944788 B2 | 6/2012 |
|---|---|---|
| KR | 10-2012-0061514 A | 6/2012 |

OTHER PUBLICATIONS

H.K. Lee et al., "Thermal analysis of asymmetric intracavity-contacted oxide-aperture VCSELs for efficient heat dissipation", Elsevier Ltd., Solid-State Electronics 53, (Jul. 26, 2009), (pp. 1086-1091).

A N Al-Omari et al., "Improved performance of top-emitting oxide-confined polyimide-planarized 980 nm VCSELs with copper-plated heat sinks", 2012 IOP Publishing Ltd, Journal of Physics D: Applied Physics, J. Phys. D: Appl. Phys. 45 (Nov. 19, 2012) 505101 (9 Pages Total), doi:10.1088/0022-3727/45/50/505101.

Toshihiko Ouchi., "Thermal Analysis of Thin-Film Vertical-Cavity Surface-Emitting Lasers Using Finite Element Method", The Japan Society of Applied Physics, Jpn. J. Appl. Phys., vol. 41 (2002), Part 1, No. 8, Aug. 2002, (pp. 5181-5186).

Michael C.Y. Huang et al., "A surface-emitting laser incorporating a high-index-contrast subwavelength grating", nature photonics ,vol. 1, Feb. 2007, www.nature.com/naturephotonics, (5 Pages Total), Feb. 1, 2007, doi:10.1038/nphoton.2006.80.

* cited by examiner

VERTICAL CAVITY SURFACE EMITTING LASER INCLUDING META STRUCTURE REFLECTOR AND OPTICAL DEVICE INCLUDING THE VERTICAL CAVITY SURFACE EMITTING LASER

CROSS-REFERENCE TO RELATED APPLICATION

This application claims priority from Korean Patent Application No. 10-2017-0036920, filed on Mar. 23, 2017, in the Korean Intellectual Property Office, the disclosure of which is incorporated herein by reference in its entirety.

BACKGROUND

1. Field

Apparatuses and methods consistent with exemplary embodiments relate to a vertical cavity surface emitting laser including a meta structure.

2. Description of the Related Art

Vertical cavity surface emitting lasers (VCSELs), unlike edge emitting lasers (EELs), have low power consumption because of a short optical gain length. Also, the VCSELs facilitate high density integration and mass production since they are manufactured as 2D arrays because of vertical emission. While the conventional EEL is asymmetrical with respect to an optical output, the VCSEL can operate in a circular symmetrical output mode, which enables efficient low-noise and stable high-speed modulation as the VCSEL is connected to an optical fiber.

The VCSEL includes a distributed Bragg reflector (DBR) having a high reflectivity of about 98% or more and thus it can function as a laser resonator. As the DBR consists of pairs of two materials with different refractive indices, lamination of tens of layers is required in order to achieve high reflectivity. Also, the DBR has low thermal conductivity (or high thermal resistance) due to phonon scattering that occurs at an interface between two materials. Thus, when a current is applied to the VCSEL including the DBR for oscillation, internally generated self-heating is not effectively dissipated, and thus, the oscillation efficiency of the VCSEL may be attenuated.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments provide a vertical cavity surface emitting laser that efficiently dissipates internally generated heat.

Further, one or more exemplary embodiments provide an optical device that uses a vertical cavity surface emitting laser as an optical source.

According to an aspect of an exemplary embodiment, there is provided a vertical cavity surface emitting laser including: a gain layer configured to generate light; a distributed Bragg reflector disposed below the gain layer; and a meta structure reflector disposed above the gain layer and including a plurality of nano structures having a sub wavelength dimension.

The meta structure reflector may further include a first support layer, and the plurality of nano structures are disposed on the first support layer.

A thickness of the first support layer may be ⅕ or greater of an oscillation wavelength of the vertical cavity surface emitting laser.

The first support layer may have a refractive index less than a refractive index of each of the plurality of nano structures.

The vertical cavity surface emitting laser may further include: a second support layer disposed on the first support layer and having a plurality of through holes corresponding to shapes of the plurality of nano structures, wherein the plurality of nano structures are respectively arranged in the plurality of through holes.

A refractive index of the second support layer may be less than a refractive index of each of the plurality of nano structures.

At least one of a thickness, a width, and an arrangement interval of the plurality of nano structures may be less than half of an oscillation wavelength of the vertical cavity surface emitting laser.

The plurality of nano structures may have a size distribution that allows the meta structure reflector to operate as a concave mirror.

The plurality of nano structures may have a size distribution that allows the meta structure reflector to operate as a convex mirror.

The plurality of nano structures may have a size distribution that allows the meta structure reflector to operated as a beam deflector.

The plurality of nano structures may have a shape distribution that allows the meta structure reflector to operate as a polarization beam splitter.

The plurality of nano structures may have asymmetric shapes.

The plurality of nano structures may have shapes and arrangements that allow a ratio of a width in a first direction to a width in a second direction perpendicular to the first direction to change according to a position of the plurality of nano structures.

A reflectance of the distributed Bragg reflector may be greater than a reflectance of the meta structure reflector.

The gain layer may include: an active layer; and an upper clad layer and a lower clad layer respectively disposed above and below the active layer.

Each of the active layer, the upper clad layer, and the lower clad layer may include a semiconductor material.

The vertical cavity surface emitting laser may further include: a heat sink configured to dissipate heat generated from the gain layer.

A region of the heat sink may include a first region that is disposed in parallel to a direction in which the distributed Bragg reflector and the gain layer are stacked and surrounds side surfaces of the vertical cavity surface emitting laser, and a second region connected to the first region and located at an upper portion of the gain layer.

A discharge path of the heat generated from the gain layer toward the hot sink may include a first path of the heat toward the second region and a second path of the heat toward the first region, wherein the first path is shorter than the second path in at least one position of the gain layer.

According to an aspect of another exemplary embodiment, there is provided an optical device includes: the vertical cavity surface emitting laser, the vertical cavity surface emitting laser being configured to emit light toward an object; a sensor configured to receive the light reflected from the object; and an analyzer configured to analyze the light received by the sensor and analyze at least one of a property, a shape, a location, and a motion of the object.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
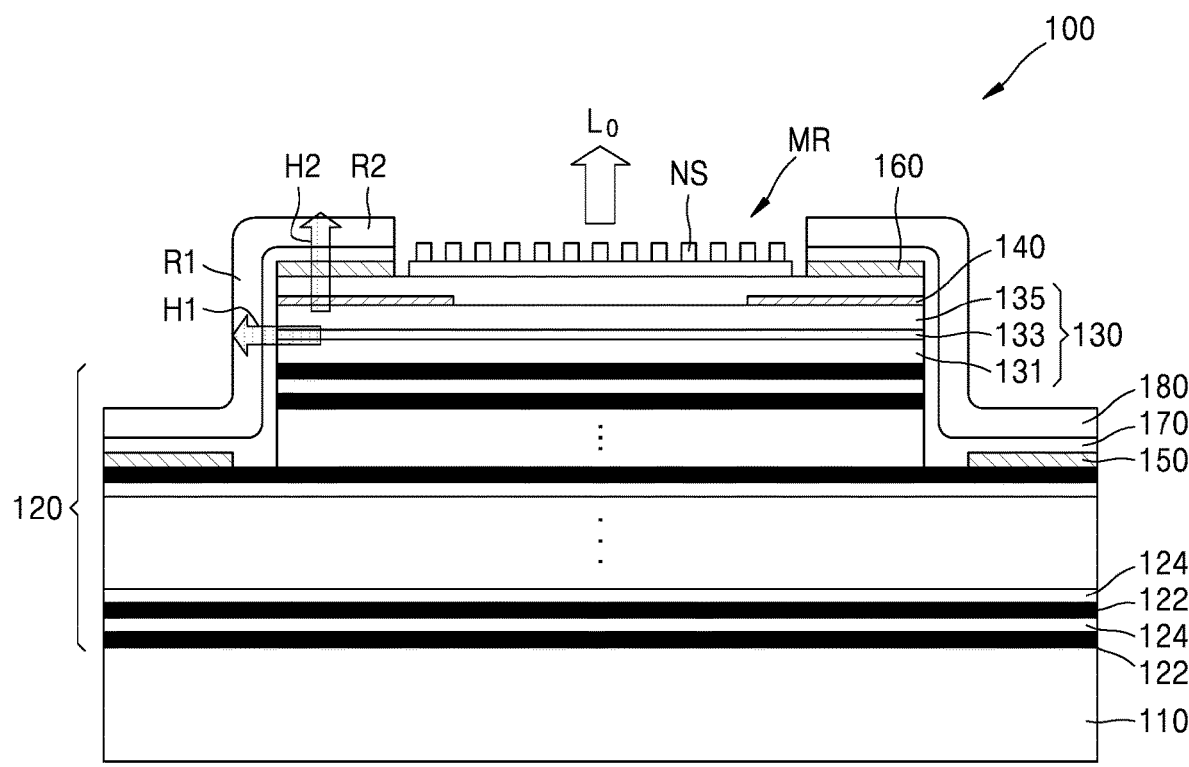
FIG. 1 is a cross-sectional view of a schematic structure of a vertical cavity surface emitting laser according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail. Expressions such as "at least one of," when preceding a list of elements, modify the entire list of elements and do not modify the individual elements of the list.

An expression such as "above" or "on" may include not only the meaning of "immediately on in a contact manner", but also the meaning of "on in a non-contact manner".

Terms such as first, second, and the like may be used to describe various elements, but the elements should not be limited to those terms. The terms are used to distinguish one element from another element.

As used herein, the singular forms are intended to include the plural forms as well, unless the context clearly indicates otherwise. When a part "includes" an element, it means that the part may further include another element rather than excluding another element, unless indicated otherwise.

The term used in the embodiments such as "unit" or "module" indicates a unit for processing at least one function or operation, and may be implemented in hardware, software, or in a combination of hardware and software.

Figure 2:
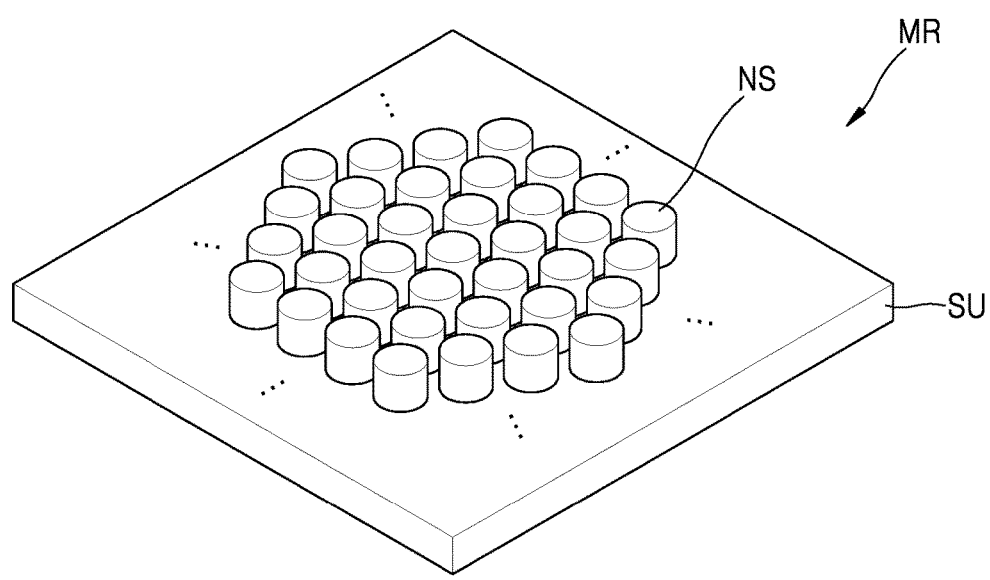
FIG. 2 is a perspective view of a schematic structure of a metal structure reflector included in the vertical cavity surface emitting laser of FIG. 1, according to an exemplary embodiment.

FIG. 1 is a cross-sectional view of a schematic structure of a vertical cavity surface emitting laser 100 according to an exemplary embodiment. FIG. 2 is a perspective view of a schematic structure of a metal structure reflector MR included in the VCSEL 100 of FIG. 1, according to an exemplary embodiment.

The VCSEL 100 may include a gain layer 130 that generates light, a distributed Bragg reflector (DBR) 120 placed below the gain layer 130, and the metal structure reflector MR placed above the gain layer 130.

The gain layer 120 is a layer that absorbs energy to generate light. The gain layer 130 may generate light, for example, by current injection or by pumping light. The gain layer 130 may include an active layer 133 including a semiconductor material. The active layer 133 may include, for example, a III-V semiconductor material or a II-VI semiconductor material. The active layer 133 may include a multi-quantum well structure including InGaAs, AlGaAs, AlGaN, InGaAsP, InGaP, or AlGaInP. The active layer 133 may include quantum dots. The active layer 133 is not limited to the materials above.

The gain layer 120 may further include an upper clad layer 135 and a lower clad layer 131 provided on upper and lower portions of the active layer 133. The upper clad layer 135 and the lower clad layer 131 may each include an N-type or P-type or an intrinsic semiconductor material. The upper clad layer 135 and the lower clad layer 131 may include a semiconductor material like the active layer 133 and may further include N-type dopants and P-type dopants, respectively.

The meta-structure reflector MR and the distributed Bragg reflector 120 placed at the upper portion and the lower portion of the gain layer 130 oscillate light generated in the gain layer 130 to amplify the light to be in a specific wavelength band. To this end, the reflectance of the distributed Bragg reflector 120 and the meta-structure reflector MR may be set to be about 90% or more. The reflectance of the distributed Bragg reflector 120 may be greater than the reflectance of the meta-structure reflector MR, and the light may be emitted through the meta-structure reflector MR, for example, at about 98% or more but is not limited to this. It is also possible to adjust the reflectance of the distributed Bragg reflector 120 and the meta-structure reflector MR so as to reverse a direction in which the light is emitted.

The meta-structure reflector MR includes a plurality of nanostructures NS having a sub-wavelength dimension. In this regard, a dimension of the sub-wavelength means that a thickness t or a width D, which defines a shape of the nanostructure NS, is less than an operating wavelength of the meta-structure reflector MR. The operating wavelength of the meta-structure reflector MR may be within a wavelength band of the light generated by the gain layer 130. The operating wavelength of the meta-structure reflector MR is a wavelength of light Lo generated by the gain layer 130, oscillated between the distributed Bragg reflector 120 and the meta-structure reflector MR and emitted. Hereinafter, the operating wavelength will be referred to as an 'oscillation wavelength'.

The nanostructure NS includes a material having a refractive index greater than that of a surrounding material (e.g., air), and may reflect light of a predetermined wavelength band according to its dimensions, specific shape, etc. At least one of a thickness, a width, and an arrangement interval of the nanostructure NS may be half or less than half of the oscillation wavelength. Generally, when the width of the nanostructure NS is less than half of the oscillation wavelength, the nanostructure NS may operate as a strong scattering unit forming a meta structure. As the arrangement interval becomes less than the wavelength, the nanostructure NS may control light incident without higher diffraction in a desired shape. When the thickness of the nanostructure NS is half or less than half of the oscillation wavelength, the nanostructure NS may operate as a meta-structure reflector MR having a high reflection characteristic, but a required thickness is not limited thereto.

The nanostructure NS may have a cylindrical shape, as shown, but is not limited thereto. The nanostructure NS has a uniform size and a constant spacing, but this is an example and the nanostructure NS is not limited thereto. The nanostructure NS may include a semiconductor material of the same type as that of the gain layer 130, but is not limited thereto. The nanostructure NS includes, for example, any one of monocrystalline silicon, polycrystalline silicon, amorphous Si, $Si_3N_4$, GaP, $TiO_2$, AlSb, AlAs, AlGaAs, AlGaInP, BP, and $ZnGeP_2$.

As shown in FIG. 2, the meta-structure reflector MR may include a support layer SU for supporting the plurality of nanostructures NS. The support layer SU may include a material having a refractive index less than the refractive index of the nanostructure NS. For example, the support layer SU may include $SiO_2$, transparent conductive oxide (TCO), or polymers such as PC, PS, and PMMA. The material of the support layer SU is not limited thereto, and may include, for example, a semiconductor material. The support layer SU and the nanostructure NS may include the same semiconductor material, for example, all III-V semiconductor compounds. Further, the refractive index of the support layer SU may be less than the refractive index of the nanostructure NS by controlling a composition ratio of the compound. A difference in the refractive index between the support layer SU and the nanostructure NS may be about 0.5 or more.

A thickness of the support layer SU may be set to be ⅕ or more of the oscillation wavelength. When the thickness of the support layer SU is less than ⅕ of the oscillation wavelength, since light resonating in the nanostructure NS on the support layer SU may be coupled to a lower layer made of the semiconductor material, a desired operation as the meta structure may not be performed.

The distributed Bragg reflector 120 may be formed by alternately laminating the first material layer 122 and the second material layer 124 having different refractive indexes to a thickness of about ¼ of a desired oscillation wavelength. The distributed Bragg reflector 120 may be formed on the semiconductor substrate 110. The distributed Bragg reflector 120 may adjust the difference in the refractive index between the two material layers 122 and 124 and the number of repetitive lamination of a pair of the two material layers 122 and 124 so that the reflectance of the dispersive Bragg reflector 120 is adjusted to have a desired value. The distributed Bragg reflector 120 may include the same material as the semiconductor material constituting the gain layer 130. For example, the first material layer 122 is an $Al_xGa_{(1-x)}As$ (0≤x≤1) layer and the second material layer 124 is an $Al_yGa_{(1-y)}As$ (0≤y≤1, x≠y) layer. The distributed Bragg reflector 120 may be doped to be of the same semiconductor type as the lower clad layer 131. For example, when the lower cladding layer 131 is of a P-type, the distributed Bragg reflector 120 may be doped with P-type impurities, and when the lower cladding layer 131 is of an N-type, the distributed Bragg reflector 120 may be doped with N-type impurities. The material of the distributed Bragg reflector 120 is not limited thereto and various materials capable of obtaining the difference in the refractive index may be used for the first material layer 122 and the second material layer 124.

The vertical cavity surface emitting laser 100 may further include an oxide aperture 140 for adjusting a mode of the emitted light or adjusting a beam size. A position of the oxide opening layer 140 is shown above the gain layer 130, but is not so limited thereto. For example, the position of the oxide opening layer 140 may be disposed in the distributed Bragg reflector 120. In addition, a plurality of oxide opening layers 140 may be provided or the oxide opening layer 140 may be omitted.

The vertical cavity surface emitting laser 100 may include a first electrode 150 and a second electrode 160 spaced apart with the gain layer 130 therebetween for current injection into the gain layer 130. The first electrode 150 may be placed under the gain layer 130 and the second electrode 160 may be placed over the gain layer 130.

The distributed Bragg reflector 120 may be etched in a mesa type as shown, for an arrangement of the first electrode 150 but this is just an example. The first electrode 150 may be formed on the lower surface of the distributed Bragg reflector 120 or the substrate 110.

The vertical cavity surface emitting laser 100 may further include a heat sink 180 for emitting heat generated in the gain layer 130. The heat sink 180 may include a metal material having a relatively high thermal conductivity, for example, copper, gold, aluminum, or the like.

The heat sink 180 may be formed to have a shape surrounding the vertical cavity surface emitting laser 100. For example, as shown in the figure, the hot sink 180 may be formed so as to extend along a side surface parallel to a stacking direction of the distributed Bragg reflector 120 and the gain layer 130 from a top surface of a position excluding a region from which light is emitted.

An insulating layer 170 may be further provided between the heat sink 180 and the first electrode 150 and between the side surface and the second electrode 160.

Heat generated in the gain layer 130 may be emitted to the outside through the heat sink 180.

A region of the heat sink 180 may be divided into a first region R1 and a second region R2. The first region R1 may be a region surrounding the side surface of the vertical cavity surface emitting laser 100. The second region R2 is connected to the first region R1 and is located at an upper portion of the gain layer 130. The second region R2 is a region of the upper surface of the vertical cavity surface emitting laser 100 excluding the region where light is emitted.

A discharge path for the heat generated in the gain layer 130 toward the heat sink 180 is divided into a first path H1 toward the first region R1 and a second path H2 toward the second region R2. In the vertical cavity surface emitting laser 100 of the embodiment, since the thin meta-structure reflector MR is placed in the upper portion of the gain layer 130 instead of the thick distributed Bragg reflector, the path length of the first path H1 and the path length of the second path H2 are substantially similar to each other, and thus, the thermal resistance of the two paths are similar to each other. The second path H2 toward the second region R2 may be formed to be shorter than the first path H1 toward the first region R1 in at least one position in the gain layer 130. Accordingly, the heat generated in the gain layer 130 may be efficiently scattered and discharged along the first path H1 and the second path H2.

As described above, the vertical resonance type surface emitting laser 100 employs the meta-structure reflector MR with a small thickness as a reflector for causing light in a specific wavelength band of light generated in the gain layer 130 to oscillate and be emitted. Thus, the vertical resonance type surface emitting laser 100 may be miniaturized and the heat generated by the light oscillation may be efficiently emitted to the outside.

Figure 3:
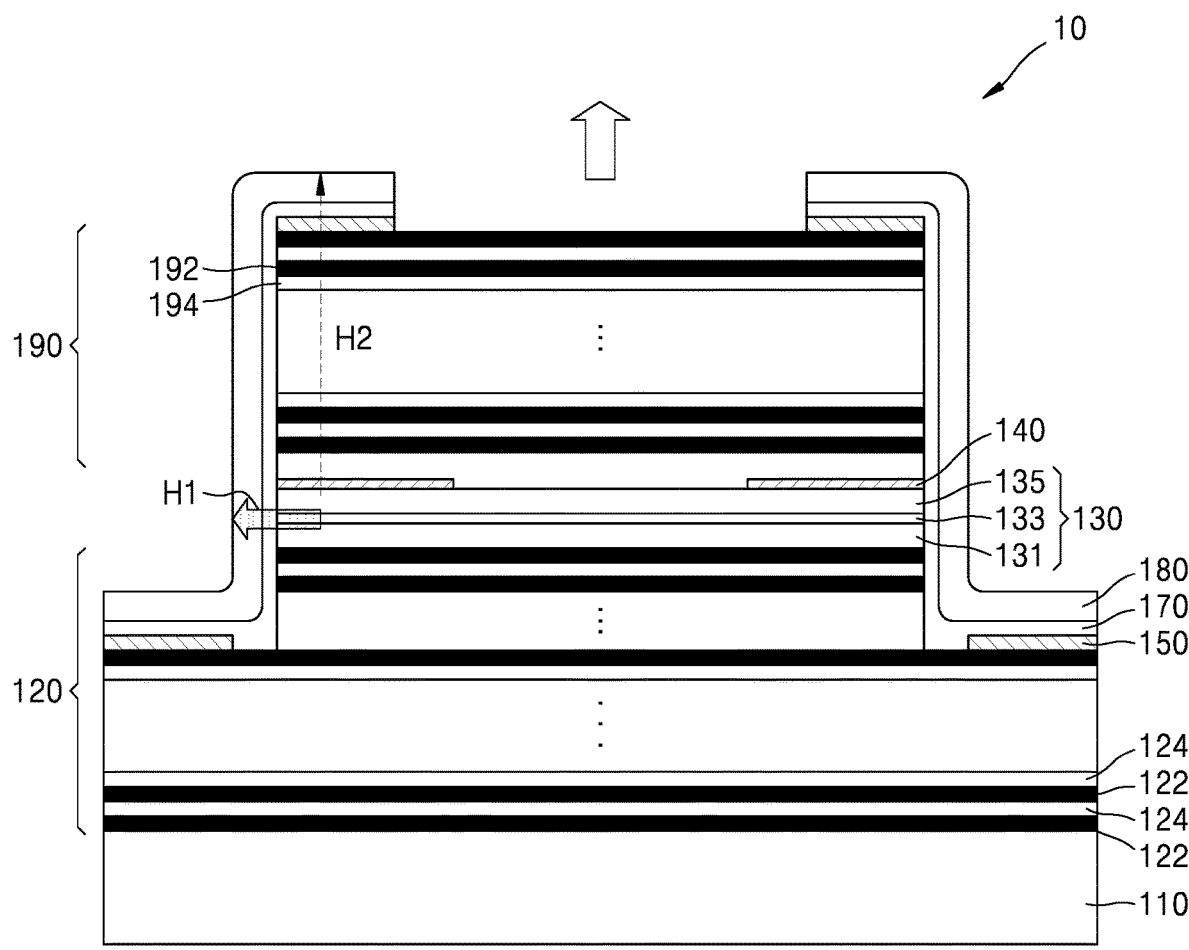
FIG. 3 is a cross-sectional view showing a schematic structure of a vertical cavity surface emitting laser according to a comparative example.

FIG. 3 is a cross-sectional view showing a schematic structure of a vertical cavity surface emitting laser 10 according to a comparative example.

The vertical resonance type surface emitting laser 10 according to the comparative example has the distributed Bragg reflector 120 placed under the gain layer 130 and a distributed Bragg reflector 190 including two material layers 192 and 194 having different refractive indices and alternately stacked above the gain layer 130. Thus, the vertical resonance type surface emitting laser 10 according to the comparative example is different from the vertical resonance type surface emitting laser 100 according to an exemplary embodiment.

The distributed Bragg reflectors 120 and 190 are formed by stacking a pair of two material layers having different refractive index several tens of times or more in order to obtain a high reflectance of 90% or more. Therefore, when heat generated in the gain layer 130 is discharged to the outside, the thermal resistance in a direction perpendicular to the stacking direction is very large. The heat generated in the gain layer 130 is mostly emitted through a path having a short path and relatively low in thermal resistance, for example, a first path H1 shown in FIG. 3, and is hardly emitted through a second path H2 having a long path and relatively high in thermal resistance.

The heat dissipation efficiency of the vertical cavity surface emitting laser 100 according to an exemplary embodiment which includes the meta structure reflector MR without using the distributed Bragg reflector 190 above the gain layer 130 is greater than that of the vertical cavity surface emitting laser 10 according to a comparative example.

Figure 4:
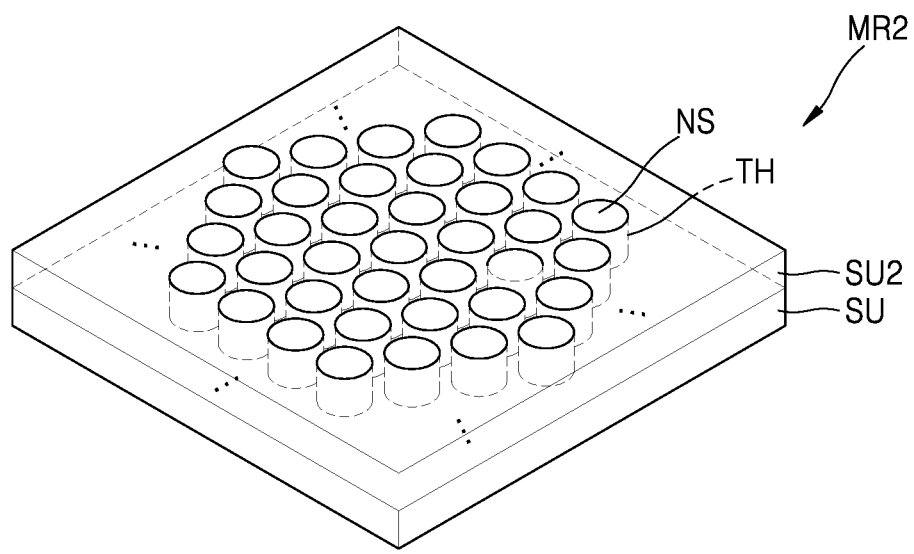
FIG. 4 is a perspective view showing a schematic structure of another example of a meta-structure reflector that may be employed in a vertical cavity surface emitting laser according to an exemplary embodiment.

FIG. 4 is a perspective view showing a schematic structure of another example of a meta-structure reflector MR2 that may be employed in a vertical resonance type surface emitting laser according to an exemplary embodiment.

The meta structure reflector MR2 may further include a second support layer SU2 having a plurality of through holes TH corresponding to the shape of the plurality of nanostructures NS on the support layer SU. The plurality of nanostructures NS may be disposed in the plurality of through holes TH, respectively.

A refractive index of the supporting layer SU2 may be less than the refractive index of the plurality of nanostructures NS. The second support layer SU2 may be formed of the same material as the support layer SU.

As shown in FIGS. 2 and 4, a shape of the nanostructure NS provided in the vertical cavity surface emitting laser 100 is a cylindrical shape, but the nanostructure NS is not limited thereto and may have various shapes.

FIGS. 5 through 8 are perspective views showing other example shapes of the nanostructure NS that may be provided in the meta structure reflectors MR and MR2 of a vertical cavity surface emitting laser according to an exemplary embodiment.

Figure 5:
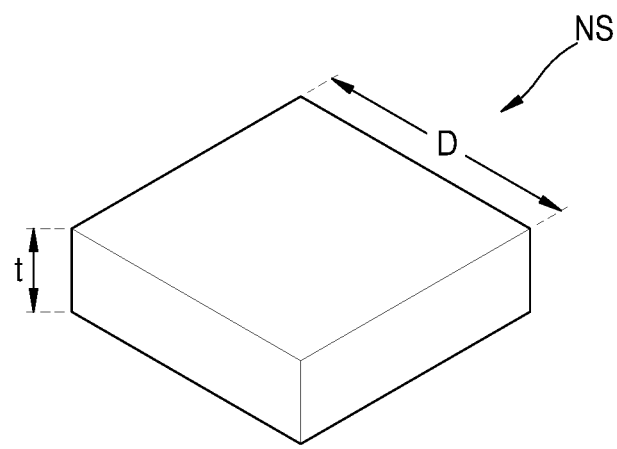
FIGS. 5, 6, 7, and 8 are perspective views showing other example shapes of a nanostructure that may be provided in meta structure reflectors of a vertical cavity surface emitting laser according to an embodiment.

As shown in FIG. 5, the nanostructure NS may have a square pillar shape with a thickness t. The shape of a cross-sectional rectangle may be a square having a length D on one side but the shape is not limited thereto and may be a rectangle. The nanostructure NS may have another polygonal columnar shape.

Figure 6:
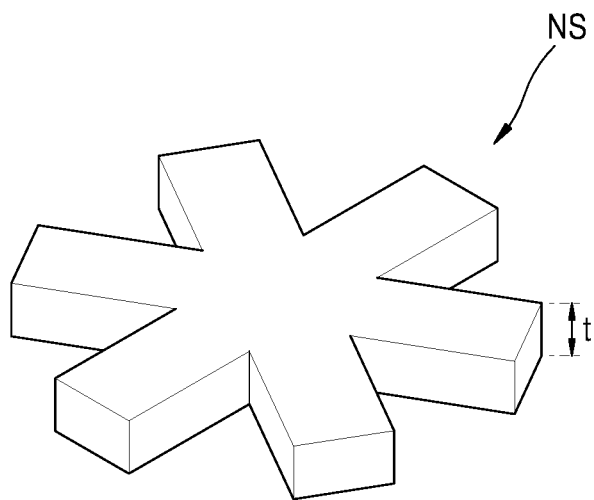

Referring to FIG. 6, the nanostructure NS may have a star-shaped cross-section. Although in this case the nanostructure NS has a symmetrical form, this is just an example, and the nanostructure NS may be modified to have an asymmetric shape.

Figure 7:
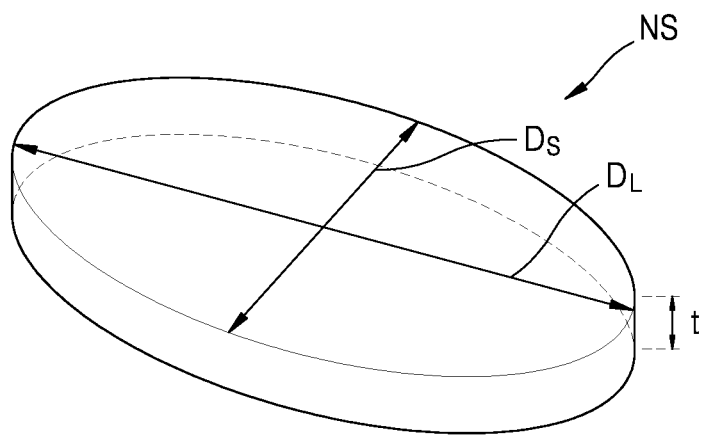

Referring to FIG. 7, the nanostructure NS has an asymmetric shape such as an elliptical column shape. When the nanostructure NS has elliptical shape having a length $D_L$ of a major axis and a length $D_S$ of a minor axis that are different from each other, the nanostructure NS may have different optical functions with respect to polarized light parallel to the major axis direction and polarized light parallel to the minor axis direction.

Figure 8:
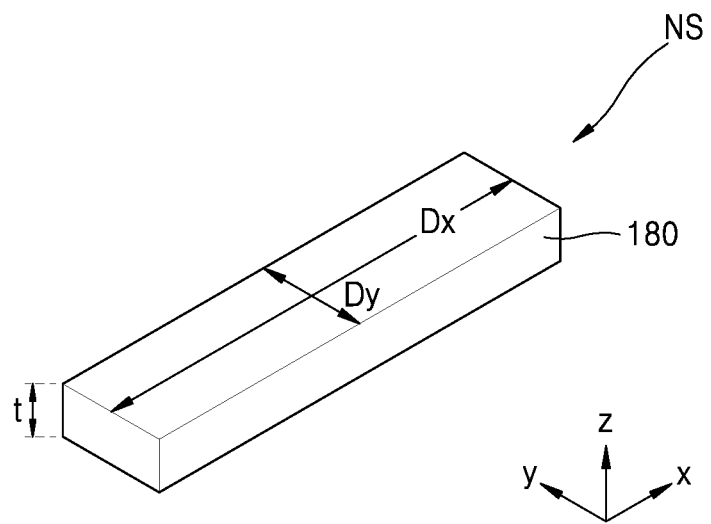

Referring to FIG. 8, the nanostructure NS may have an asymmetric shape, and may have a rectangular parallelepiped shape having a rectangular cross section with a vertical length Dx and a horizontal length Dy. Similar to the case of FIG. 7, when the nanostructure NS has the shape of FIG. 8, the nanostructure NS may also have an optical function with respect to polarization in a specific direction.

The meta structure reflector MR may be used by appropriately adjusting the shape, size, and arrangement rules of the nanostructures NS to additionally adjust a shape of light generated in the gain layer 130 and reflected, oscillated, and emitted from the meta-structure reflector MR and the distributed Bragg reflector 120.

Hereinafter, meta-structure reflectors having additional optical functions by applying various arrangement rules will be described.

Figure 9:
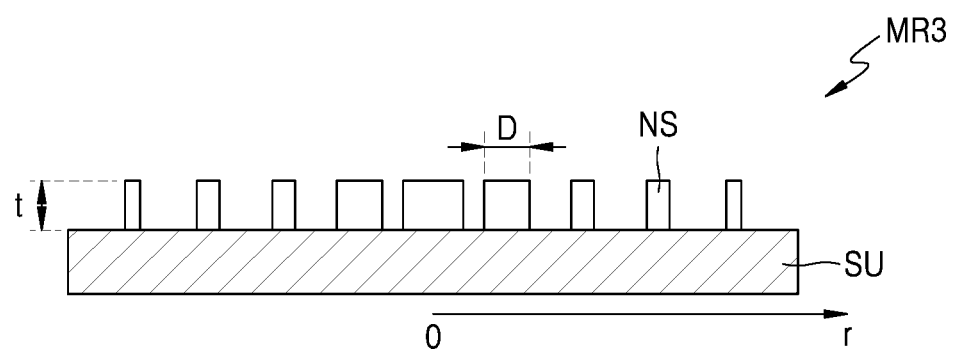
FIG. 9 is a cross-sectional view showing a schematic structure of another example of a meta-structure reflector that may be employed in a vertical cavity surface emitting laser according to an exemplary embodiment.

FIG. 9 is a cross-sectional view showing a schematic structure of another example of a meta-structure reflector MR3 that may be employed in a vertical resonance type surface emitting laser according to an exemplary embodiment.

The meta structure reflector MR3 includes the support layer SU and the plurality of nanostructures NS formed on the support layer SU. The shape and arrangement rules of the nanostructures NS may be set so that the meta structure reflector MR3 functions as a convex mirror. The shape dimension at each position of the nanostructures NS is determined according to an optical function to be implemented by the meta structure reflector MR. For example, when a position r of the nanostructure NS is defined as a distance in a radial direction from the center of the meta structure reflector MR, the size of the nanostructure NS at the position is D(r). Referring to FIG. 9, the value of D decreases from the center to the radial direction, and an example rule may be repeated in the radial direction. The repetition period is not constant but may vary. Depending on the design of the meta-structure reflector MR3, a D value distribution of opposite tendency is possible from the center to the radial direction. A degree of the function of the convex mirror implemented by the meta-structure reflector MR3 may be adjusted by a value applied to D(r) according to the position r of the nanostructure NS. Even if an optical performance changes since D(r) is set, a physical curvature change does not occur, and thus, the thickness of the meta structure reflector MR3 may be maintained constant.

Figure 10:
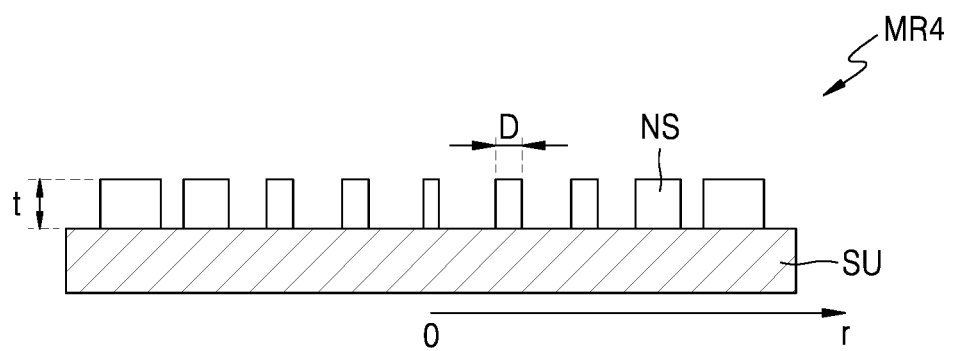
FIG. 10 is a cross-sectional view showing a schematic structure of another example of a meta-structure reflector that may be employed in a vertical cavity surface emitting laser according to an exemplary embodiment.

FIG. 10 is a cross-sectional view showing a schematic structure of another example of a meta-structure reflector MR4 that may be employed in a vertical resonance type surface emitting laser according to an exemplary embodiment.

Referring to FIG. 10, the meta structure reflector MR4 includes the support layer SU and the plurality of nanostructures NS formed on the support layer SU. The shape and arrangement rule of the nanostructure NS may be set so that the meta-structure reflector MR4 serves as a concave mirror. When the position r of the nanostructure NS is defined as a distance in a radial direction from the center of the meta-structure reflector MR4, the diameter D(r) of the nanostructure NS at the position may be determined as a specific value so that the meta structure reflector MR4 operates as the concave mirror. The value of D increases from the center to the radial direction, and the example rule may be repeated in the radial direction. A repetition period is not constant but may vary. Also, according to the design of the meta-structure reflector MR4, the value of D may decrease from the center to the radial direction.

Figure 11:
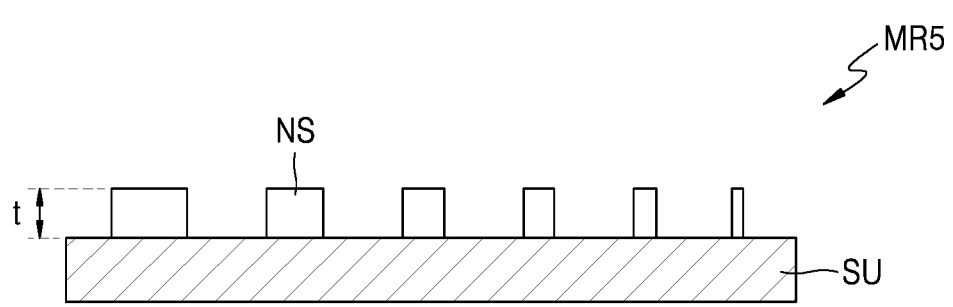
FIG. 11 is a cross-sectional view showing a schematic structure of another example of a meta structure reflector that may be employed in a vertical cavity surface emitting laser according to an exemplary embodiment.

FIG. 11 is a cross-sectional view showing a schematic structure of another example of a meta structure reflector MR5 that may be employed in a vertical resonance type surface emitting laser according to an exemplary embodiment.

Referring to FIG. 11, the meta-structure reflector MR5 includes the support layer SU and the plurality of nanostructures NS formed on the support layer SU. In the present embodiment, the meta-structure reflector MR5 has dimensions and an arrangement so as to oscillate light together with the distributed Bragg reflector 120 and additionally deflect emission light. The nanostructures NS may have shapes to gradually decrease along one direction. In addition, arrays as one unit of period may be repeatedly arranged in a horizontal direction.

The meta structure reflectors MR3, MR4, and MR5 shown in FIGS. 9 through 11 are employed in the vertical cavity surface emitting laser 100 so that the optical performance such as a beam diameter, convergence/divergence shapes, a direction of the emission light may be modified. Also, the meta structure reflectors MR3, MR4, and MR5 may be modified to have other size distributions to have additional functions such as beam forming.

FIGS. 5 through 8 illustrates shapes of the nanostructure NS provided in the meta structure reflectors MR3, MR4, and MR5 of FIGS. 9 through 11. When the nanostructure NS having an asymmetric shape is employed, the above-described optical action may be performed on polarization in a specific direction determined by asymmetry.

It is also possible to perform a function of a polarizing beam splitter by differently defining the arrangement rule of the nanostructure NS having asymmetry depending on a direction.

Figure 12:
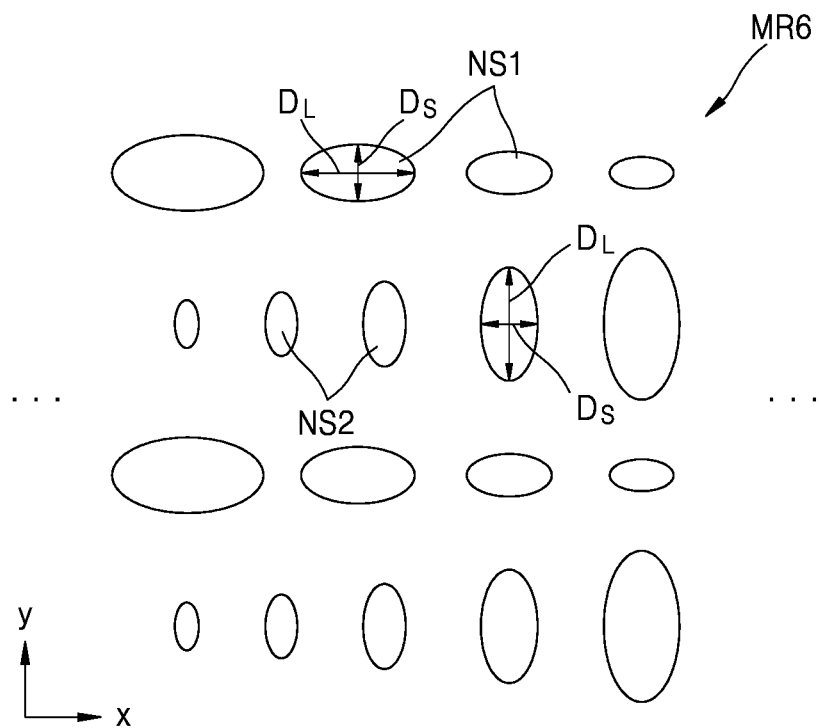
FIG. 12 is a plan view showing an exemplary shape and arrangement of nanostructures NS in another example of a meta structure reflector MR6 that may be employed in a vertical cavity surface emitting laser according to an exemplary embodiment.

FIG. 12 is a plan view showing an example shape and arrangement of nanostructures NS in another example of a meta structure reflector MR6 that may be employed in a vertical resonance type surface emitting laser according to an exemplary embodiment.

Referring to FIG. 12, the meta-structure reflector MR6 includes nanostructures NS1 having a a major axis length $D_L$ in a y-direction and a minor axis length $D_S$ in an x-direction and nanostructures NS2 having a major axis $D_L$ in the x-direction and a minor axis length $D_S$ in the y-direction.

The nanostructures NS1 are arranged such that sizes thereof decrease along the x direction. The nanostructures NS2 are arranged such that sizes thereof increase along the x direction. Due to the size varying tendency of the nanostructures NS1 and NS2 in the x and y directions, when oscillating light is emitted, light of different polarizations is deflected in different directions and shapes of the light of different polarizations may be independently adjusted.

Figure 13:
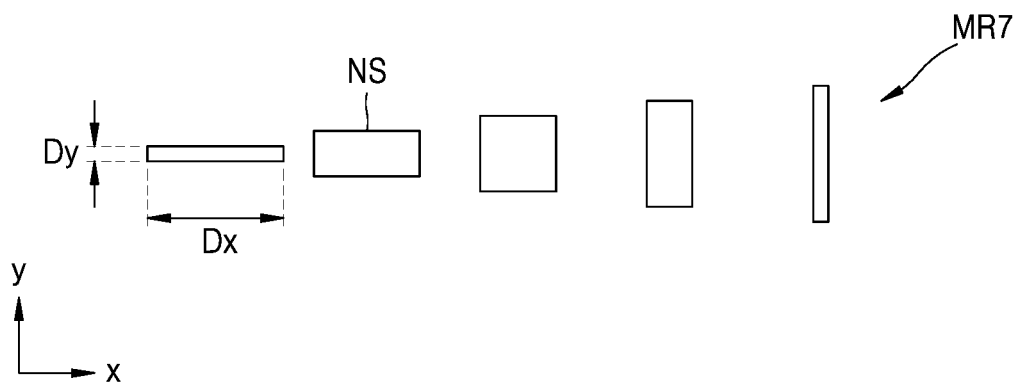
FIG. 13 is a plan view showing an example shape and arrangement of nanostructures in another example of a meta structure reflector that may be employed in a vertical cavity surface emitting laser according to an exemplary embodiment.

FIG. 13 is a plan view showing an example shape and arrangement of the nanostructures NS in another example of a meta structure reflector MR7 that may be employed in a vertical resonance type surface emitting laser according to an exemplary embodiment.

The nanostructure NS constituting the meta-structure reflector MR7 may have an asymmetrical shape and a rectangular parallelepiped shape having rectangular cross sections with a lengthwise length Dx and a widthwise length Dy that are different from each other. The nanostructures NS are arranged along the x direction, the length Dx parallel to the x direction gradually decreases, and the length Dy parallel to the y direction gradually increases so that the shapes and arrangements of the nanostructures NS may be determined. According to this shape, when oscillating light is emitted, different optical actions may be undertaken with respect to the light of different polarizations.

The vertical cavity surface emitting laser 100 employing the above-described meta structure reflector is advantageous for downsizing, high-speed operation, and low power consumption, and also may change the optical properties of emitted light. Thus, the vertical cavity surface emitting laser 100 may be employed for optical sensors, light IC systems, light sources for various optical devices, etc.

Figure 14:
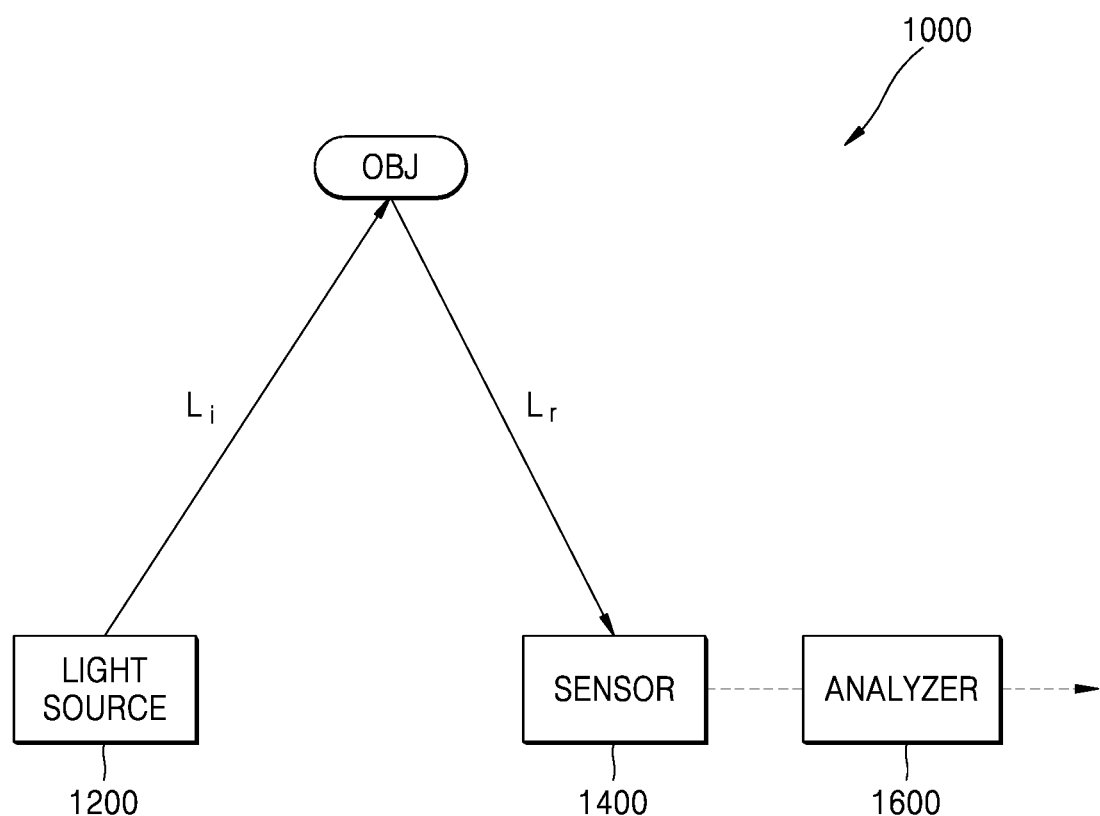
FIG. 14 is a block diagram showing a schematic structure of an optical device according to an exemplary embodiment.

FIG. 14 is a block diagram showing a schematic structure of an optical device 1000 according to an exemplary embodiment.

The optical device 1000 includes a light source 1200 that emits light toward an object OBJ, a sensor 1400 that receives light reflected from the object OBJ, and an analyzer 1600 that analyzes the light received by the sensor unit 1400 and at least one of a shape, a position, and a motion of the object OBJ.

As the light source 1200, a vertical cavity surface emitting laser including one of the above-described meta structure reflectors may be used.

Optical element for performing an additional function such as adjusting a direction of the light in the light source 1200 toward the object OBJ, adjusting the size of the beam, or modulating the light to a pattern light may be further provided between the light source 1200 and the object OBJ. Alternatively, when the meta-structure reflector included the light source 1200 has a shape and arrangement suitable for performing such function, the optical element between the light source 1200 and the object OBJ may be omitted.

The sensor 1400 senses light Lr reflected by the object OBJ. The sensor 1400 may include an array of light detecting elements. The sensor 1400 may further include a spectroscopic device for analyzing the light reflected from the object OBJ for each wavelength.

The analyzer 1600 may analyze at least one of physical properties, shape, position, and motion of the object OBJ by analyzing the light received by the sensor 1400. The three-dimensional shape, position, and motion of the object OBJ may be analyzed by comparing the pattern of the light Li irradiated on the object OBJ with the pattern of the light Lr reflected from the object OBJ. Alternatively, it is also possible to analyze the wavelength of the light excited in the object OBJ by the incident light to determine the physical properties of the object OBJ.

The optical device 1000 may further include a controller for generally controlling the operation of the light source 1200 or the operation of the sensor 1600. Also, the optical device 1000 may further include a memory storing a calculation program for extracting 3D information that is to be performed by the analyzer 1400 and the like.

Information about a calculation result in the analyzer 1600, that is, information about the shape, position, physical properties, etc. of the object OBJ, may be transmitted to another device. For example, the above information may be transmitted to a controller of an electronic device including the optical device 1000.

The optical device 1000 may also be utilized as a sensor for precisely acquiring three-dimensional information about a front object and may be employed in various electronic devices. Such an electronic device may be, for example, an autonomous driving device such as an unmanned vehicle, an autonomous vehicle, a robot, a drone or the like, as well as an augmented reality device, a mobile communication device, or an ioT (internet of things) device.

The above-described vertical cavity surface emitting laser has a meta structure reflector having a sub-wavelength dimension, which is advantageous for low power consumption, high-speed operation, miniaturization, and can be used as a light source for another optical device.

According to the above-described vertical cavity surface emitting laser, the shape and arrangement of the nanostructure may be adjusted so that the meta structure reflector has an additional optical function, and thus, the optical performance such as, beam diameter, direction, convergence/divergence shapes, polarization, etc. of an emission beam may be adjusted.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A vertical cavity surface emitting laser comprising:
a gain layer configured to generate light;
a distributed Bragg reflector disposed below the gain layer; and
a meta structure reflector disposed above the gain layer and comprising a plurality of nano structures having a sub wavelength dimension less than an oscillation wavelength of the vertical cavity surface emitting laser,
wherein the plurality of nano structures are configured so that
a reflectance of the meta structure reflector is greater than 90%, and
light amplified between the distributed Bragg reflector and the meta structure reflector is output through the plurality of nano structures.

2. The vertical cavity surface emitting laser of claim 1, wherein the meta structure reflector further comprises a first support layer, and
wherein the plurality of nano structures are disposed on the first support layer.

3. The vertical cavity surface emitting laser of claim 2, wherein a thickness of the first support layer is 1/5 or greater of the oscillation wavelength of the vertical cavity surface emitting laser.

4. The vertical cavity surface emitting laser of claim 2, wherein the first support layer has a refractive index less than a refractive index of each of the plurality of nano structures.

5. The vertical cavity surface emitting laser of claim 2, further comprising:
a second support layer disposed on the first support layer and having a plurality of through holes corresponding to shapes of the plurality of nano structures,
wherein the plurality of nano structures are respectively arranged in the plurality of through holes.

6. The vertical cavity surface emitting laser of claim 5, wherein a refractive index of the second support layer is less than a refractive index of each of the plurality of nano structures.

7. The vertical cavity surface emitting laser of claim 1, wherein at least one of a thickness, a width, and an arrangement interval of the plurality of nano structures is less than half of the oscillation wavelength of the vertical cavity surface emitting laser.

8. The vertical cavity surface emitting laser of claim 1, wherein the plurality of nano structures has a size distribution that allows the meta structure reflector to operate as a concave mirror or a convex mirror.

9. The vertical cavity surface emitting laser of claim 1, wherein the distributed Bragg reflector disposed only below the gain layer, and any other distributed Bragg reflector is not disposed above the gain layer.

10. The vertical cavity surface emitting laser of claim 1, wherein the plurality of nano structures has a size distribution that allows the meta structure reflector to operated as a beam deflector.

11. The vertical cavity surface emitting laser of claim 1, wherein the plurality of nano structures has a shape distribution that allows the meta structure reflector to operate as a polarization beam splitter.

12. The vertical cavity surface emitting laser of claim 11, wherein the plurality of nano structures have asymmetric shapes.

13. The vertical cavity surface emitting laser of claim 12, wherein the plurality of nano structures have shapes and arrangements that allow a ratio of a width in a first direction to a width in a second direction perpendicular to the first direction to change according to a position of the plurality of nano structures.

14. The vertical cavity surface emitting laser of claim 1, wherein a reflectance of the distributed Bragg reflector is greater than a reflectance of the meta structure reflector.

15. The vertical cavity surface emitting laser of claim 1, wherein the gain layer comprises:
an active layer; and
an upper clad layer and a lower clad layer respectively disposed above and below the active layer.

16. The vertical cavity surface emitting laser of claim 15, wherein each of the active layer, the upper clad layer, and the lower clad layer comprises a semiconductor material.

17. The vertical cavity surface emitting laser of claim 1, further comprising:

a heat sink configured to dissipate heat generated from the gain layer.

18. The vertical cavity surface emitting laser of claim 17, wherein a region of the heat sink comprises;
   a first region that is disposed in parallel to a direction in which the distributed Bragg reflector and the gain layer are stacked and surrounds side surfaces of the vertical cavity surface emitting laser; and
   a second region connected to the first region and located at an upper portion of the gain layer.

19. The vertical cavity surface emitting laser of claim 18, wherein a discharge path of the heat generated from the gain layer toward the heat sink includes a first path of the heat toward the second region and a second path of the heat toward the first region, and
   wherein the first path is shorter than the second path in at least one position of the gain layer.

20. An optical device comprising:
   the vertical cavity surface emitting laser of claim 1, the vertical cavity surface emitting laser being configured to emit light toward an object;
   a sensor configured to receive the light reflected from the object; and
   an analyzer configured to analyze the light received by the sensor and analyze at least one of a property, a shape, a location, and a motion of the object.

* * * * *